(12) United States Patent
Sikora et al.

(10) Patent No.: US 6,179,640 B1
(45) Date of Patent: Jan. 30, 2001

(54) HIGH TEMPERATURE MINIMAL (ZERO) INSERTION FORCE SOCKET

(75) Inventors: Robert Sikora, San Jose; Adalberto M. Ramirez, Hayward; Maurice Evans, Pacifica; Yongbum (Peter) Cuevas, Los Gatos; Robert Sylvia, Santa Clara, all of CA (US)

(73) Assignee: Qualitau, Inc., Sunnyvale, CA (US)

( * ) Notice: Under 35 U.S.C. 154(b), the term of this patent shall be extended for 0 days.

(21) Appl. No.: 09/283,678

(22) Filed: Apr. 1, 1999

(51) Int. Cl.[7] ........................................ H01R 4/50
(52) U.S. Cl. ............................... 439/342; 439/259
(58) Field of Search .................... 439/259, 266, 439/342

(56) References Cited

U.S. PATENT DOCUMENTS

| | | | |
|---|---|---|---|
| 5,021,000 | * | 6/1991 | Scheibner ........................... 439/342 |
| 6,004,141 | * | 12/1999 | Abe et al. ............................ 439/73 |
| 6,004,152 | * | 12/1999 | Walkup et al. ..................... 439/342 |

* cited by examiner

Primary Examiner—Khiem Nguyen
(74) Attorney, Agent, or Firm—Townsend and Townsend and Crew LLP; Henry K. Woodward

(57) ABSTRACT

A socket for use in testing packaged integrated circuits having leads depending therefrom includes a first member for receiving the integrated circuit package and having a plurality of holes for receiving leads extending from the package. A second member has a plurality of wire contacts for engaging the leads, the first and second members being arranged to permit relative lateral translation thereof. A cam is provided for sliding the first member relative to the second member and moving leads extending through the holes in the first member into engagement with the contacts of the second member. A socket for dual in-line integrated circuit package (DIP) has two rows of holes in the first member, and two slots are provided in the second member each aligned with a row of holes. The wire contacts extend across each slot. For high temperature operation (greater than 250° C.) the first and second members comprise anodized aluminum or a ceramic, and the wires comprise Monel or other high temperature material.

11 Claims, 2 Drawing Sheets

HIGH TEMPERATURE MINIMAL (ZERO) INSERTION FORCE SOCKET

BACKGROUND OF THE INVENTION

This invention relates generally to the testing of electrical integrated circuits, and more particularly the invention relates to sockets for receiving packaged integrated circuits for test purposes.

The packaged integrated circuit typically includes a polymer or ceramic housing for a semiconductor chip with electrical leads extending from the package which are electrically connected to the semiconductor chip. In a dual in-line package (DIP), the electrical leads are arranged in two parallel rows with the leads depending from the bottom of the housing.

Packaged integrated circuits must undergo a number of different tests, each test requiring the insertion of the integrated circuit package and leads into a test socket. To prevent bending or damage to the leads, zero insertion force (ZIF) sockets have been devised to limit the force exerted on the leads when the package is inserted into a test socket. The most widely known and used ZIF sockets are from 3M Corporation and Aries Corporation. In these sockets the leads of a DIP (dual in-line package) are pinched between two pieces of metal which are, in turn, soldered to a printed circuit board. The metal pieces are held in place by the body of the ZIF socket which is typically made of plastic. The metal pieces are electrically conducting to provide a good electrical path from the DIP lead to the printed circuit board in which the ZIF socket is attached. In all cases, the bodies of these sockets are made of some organic material (plastics or polymers) which can only withstand temperatures as high as 250° C. for extended periods of time. The metal used to pinch the leads of the IC DIP packages are beryllium copper alloy or beryllium nickel alloy for a high temperature operation not to exceed 250° C. While these sockets perform well within their stated specifications, they cannot be used at temperatures in excess of 250° C. because the materials will decompose and fail.

The present invention is directed to providing a test socket which is simple in design and reliable in high temperature (above 250° C.) environments.

SUMMARY OF THE INVENTION

In accordance with the invention, a test socket includes at least two members having planar surfaces arranged to permit relative lateral movement between the two members. One member is a package support and has a plurality of holes extending therethrough for receiving the integrated circuit package leads. Each hole has sufficient size to receive a lead with minimal or no force. The second member is a contact support and has a plurality of contacts arranged to be in spaced juxtaposition with package leads when a package is inserted into or removed from the support member. The contacts are slidable into engagement with the package leads after the package is inserted.

In a preferred embodiment, the plurality of contacts comprise wires positioned in grooves in the second member with the grooves arranged in alignment with the holes in the first member. The two members are joined by linear translation device such as a cam mechanism whereby the two planar surfaces can be translated laterally for engaging and disengaging the package leads with the wire contacts.

For high temperature applications the two members can comprise anodized aluminum or a ceramic material such as silicon carbide, and the wire contacts can comprise Monel or other conductor which can withstand high temperature. The two planar surfaces can engage each other, or spacers can be provided between the surfaces to facilitate sliding.

The invention and objects and features thereof will be more readily apparent from the following detailed description and appended claims when taken with the drawings.

DETAILED DESCRIPTION OF ILLUSTRATIVE EMBODIMENT

Figure 1:
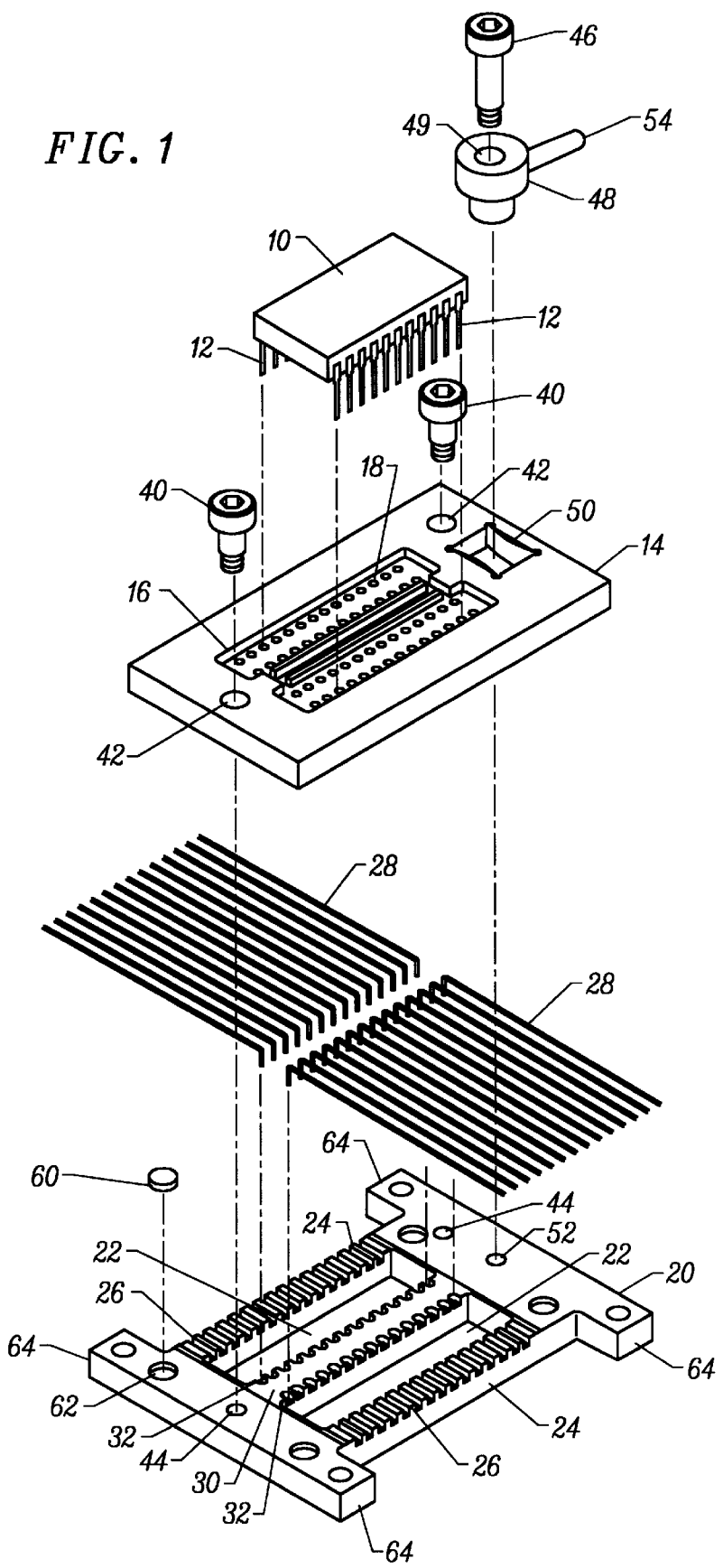
FIG. 1 is an exploded perspective view of a DIP package and a test socket in accordance with one embodiment of the invention.

Referring now to the drawing. FIG. 1 is an exploded perspective view of a dual in-line package (DIP) 10 which has a plurality of leads 12 arranged in two rows and depending from the body of DIP 10. The socket includes a first member 14 for receiving DIP 10 in a recessed portion 16 with the recessed portion having a plurality of holes 18 extending through member 14 and arranged in rows for receiving leads 12 of DIP 10. In this embodiment the holes 18 are arranged in four rows to accommodate packages having rows of contacts with different spacings.

Figure 2:
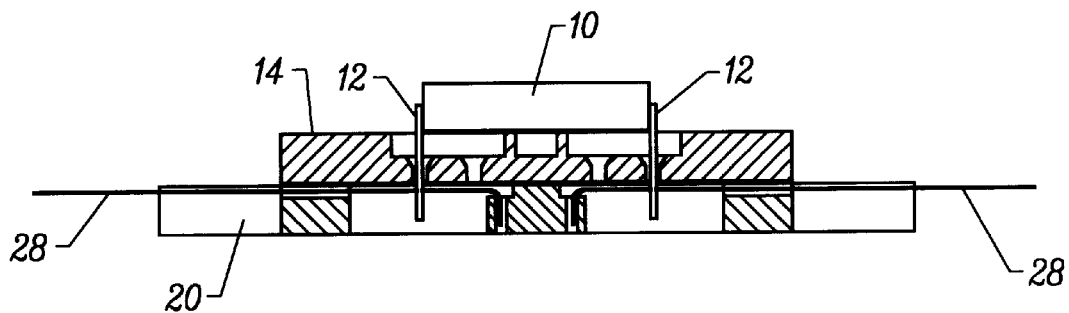
FIG. 2 is a section view of the assembled package and socket of FIG. 1.

A second member 20 has parallel slots 22 arranged to receive the contacts 12 of a DIP. Outer portions 24 of the slots have recesses 26 therein for receiving rows of wires 28. An inner portion 30 between the slots 22 have two rows of holes 32 for receiving ends of wires 28. FIG. 2 is a section view of the DIP 10 in the assembled members 14 and 20 and illustrates the positioning of leads 12 relative to the wires 28.

The holes 18 in first member 14 have sufficient size to receive leads 12 with minimal or zero insertion force. In one embodiment the holes are circular in cross-section and have a diameter which is larger than the width of leads 12. When assembled the wires 28 are spaced so that each lead 12 is positioned between two wires 28 in juxtaposition therewith but spaced therefrom.

The two members are assembled by set screws 40 which extend through holes 42 in member 14 and engage threaded holes 44 in member 20. Holes 42 have sufficient diameter to allow set screws 40 to translate laterally therein. A linear translation device comprises a set screw 46 and cam 48 which are positioned in a rectangular slot 50 in member 14 with set screw 46 engaging a threaded hole 52 in member 20. The hole 49 through cam 48 is off centered whereby rotation of cam 48 by means of handle 54 laterally translates the first member 14 relative to the second member 20.

Figure 3:
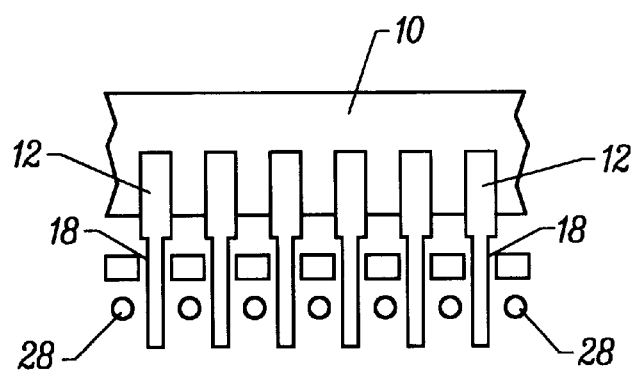
FIG. 3 and FIG. 4 illustrate the relative positioning of package leads and socket contacts when inserting or removing a package and when electrically testing a package, respectively.
Figure 4:
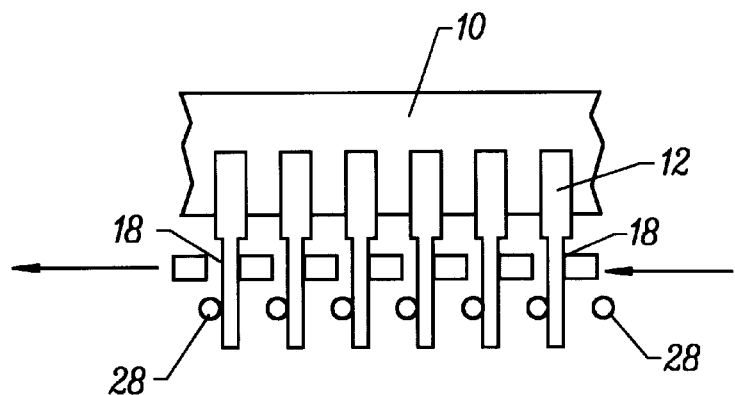

FIGS. 3 and 4 are partial section views illustrating the arrangement of leads 12 depending from DIP package 10 through the holes 18 of first member 14 in juxtaposition with wires 28 when the package is inserted or removed from the socket and when the leads are moved into engagement with the wires 28, respectively. In FIG. 3 leads 12 extend through holes 18 without contacting the sides of holes 18 and in spaced juxtaposition with the wire contacts 28. In FIG. 4 relative translation between first member 14 and second member 20 by cam 48, as indicated by the arrows, moves leads 12 into physical and electrical engagement with wires 28 for a test procedure. Following the test procedure, the two members are again moved in relative lateral translation so that the leads and wires have the relationship shown in FIG. 3 and the DIP can be removed from the socket.

In a high temperature (greater than 250° C.) test environment, the first and second members comprise a high temperature material such as anodized aluminum or a ceramic such as silicon carbide. The two parallel surfaces of the two members can in sliding engagement, or alternatively ceramic inserts can be positioned between the two parallel surfaces to facilitate sliding. In FIG. 1 one insert 60 is received in a recess 62. Several such inserts are employed to facilitate sliding. Flanges 64 extend from the member 20 for mounting purposes. The wire contacts 28 are preferably a high temperature wire made of Monel or other suitable high temperature wire material.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A socket for use in testing a packaged integrated circuit having a plurality of leads extending therefrom, said socket comprising:

a) a first member for receiving an integrated circuit and having a plurality of holes for receiving leads extending form the package the first member including a plurality of holes arranged in two parallel rows for receiving leads from a dual in-line integrated circuit package b) a second member having a plurality of contacts for engaging the leads, the first and second members being arranged to permit relative lateral translation thereof, the second member including two slots with wires extending across each slot, each slot being aligned with a row, and c) a lateral translation device for sliding the first member relative to the second member and moving leads extending through the first member into engagement with the contacts, the lateral translation device comprising a cam which includes a circular pin extending from the second member through a hole in the first member, the hole having a diameter larger than the diameter of the pin, the pin being rotatably attached to the second member with the point of rotation being offset from the center of the pin.

2. The socket as defined in claim 1 wherein the lateral translation device comprises a cam.

3. The socket as defined by claim 1 wherein each hole is larger than a lead whereby the leads can be inserted into the holes with minimal insertion force.

4. The socket as defined by claim 3 wherein each hole has a circular cross-section.

5. The socket as defined by claim 3 wherein the second member has a slot therein with the contacts extending across the slot, the leads extending from the first member into the slot in juxtaposition with the contacts.

6. The socket as defined by claim 4 wherein each contact comprises an electrically conductive wire.

7. The socket as defined by claim 6 wherein the first member includes a plurality of holes arranged in two parallel rows for receiving leads from a dual in-line integrated circuit package, the second member including two slots with wires extending across each slot, each slot being aligned with a row.

8. The socket as defined by claim 1 wherein the first and second members comprise anodized aluminum.

9. The socket as defined by claim 8 wherein spacers are provided between the first and second members to facilitate relative lateral translation thereof.

10. The socket as defined by claim 1 wherein the first and second members comprise ceramic.

11. The socket as defined by claim 1 and further including lugs at comers of the second member for mounting the socket.

* * * * *